United States Patent
Wang

[11] Patent Number: 5,175,670
[45] Date of Patent: Dec. 29, 1992

[54] HOUSING STRUCTURE FOR A COMPUTER

[76] Inventor: Huo-Tong Wang, No. 20, Jeng-Nan Rd., Ho-May Jenn, Changhua Shien, Taiwan

[21] Appl. No.: 773,803

[22] Filed: Oct. 9, 1991

[51] Int. Cl.$^5$ .................. H05K 5/04; H05K 7/18; H02B 1/01
[52] U.S. Cl. ................... 361/390; 361/380; 361/427; 361/429
[58] Field of Search .............. 364/708; 312/265.1, 312/265.2, 265.3, 265.4, 7.2, 223; 361/380, 390, 392, 394, 395, 399, 415, 427, 428, 429

[56] References Cited

U.S. PATENT DOCUMENTS

| | | | |
|---|---|---|---|
| 4,750,088 | 6/1988 | Friot | 361/415 X |
| 4,847,733 | 7/1989 | Roy et al. | 361/427 |
| 4,927,111 | 5/1990 | Takahashi | 361/415 X |
| 4,976,358 | 12/1990 | Stickel et al. | 361/415 X |
| 5,031,070 | 7/1991 | Hsu | 361/380 |
| 5,053,925 | 10/1991 | Kitajima | 361/415 X |
| 5,067,041 | 11/1991 | Cooke et al. | 361/394 |

*Primary Examiner*—Leo P. Picard
*Assistant Examiner*—Michael W. Phillips
*Attorney, Agent, or Firm*—Browdy and Neimark

[57] ABSTRACT

A high-capacity computer case comprises a front case plate, a rear case plate, three reinforced rods, a computer locking plate, a bottom plate, and a slot clip member. The front case plate is provided with an upper disk drive mount and a lower disk drive mount, which are welded respectively to the back side thereof. Located between the front case plate and the rear case plate in a parallel manner are three reinforced rods. The computer locking plate is arranged at the lower half portion of one side of the computer case, with both ends of locking plate, in conjunction with the three reinforced rods, being spot welded to the front and the rear case plates. The bottom plate is welded respectively to the front case plate, the rear case plate, and the three reinforced rods. The slot cip member of rectangular construction is a supplementary device comprising at one end thereof two lugs having thereon arresting portions and at other end thereof a predetermined number of clip grooves for disposing a longer expansion slot card.

2 Claims, 3 Drawing Sheets

HOUSING STRUCTURE FOR A COMPUTER

BACKGROUND OF THE INVENTION

The present invention relates to a computer housing, and more particularly to a high-capacity computer case.

The computer case used to house therein an upright main computer is of a rectangular body, which is often known as a big tower case in the trade. As shown in FIG. 1, such conventional computer case comprises front and rear iron plates 1 and 2, in conjunction with upper and lower iron plates 3 and 4, supplementary rod 5, and side plate 6. Such computer case is not structurally strong enough to withstand a severe impact. In addition, such computer case is provided with a limited capacity for disk drives, which are mounted in the disk drive mount 7 located at the upper front portion of the case. In most cases, the disk drive mount 7 can accommodate only six 5¼" disk drives, which are often insufficient to support the operational requirements of the computer system. Furthermore, the power supply device of an upright computer can be placed into the case only from the side of the case so as to be secured to the positioning plate 8. Such a layout makes the assembly of the computer case unnecessarily complicated.

SUMMARY OF THE INVENTION

It is therefore the primary objective of the present invention to provide a high-capacity computer case with a plurality of reinforced rods to enhance the structural integrity of the computer case, which is highly resistant to impact.

It is another objective of the present invention to provide a high-capacity computer case with means permitting various computer components to be assembled therein easily and conveniently.

It is still another objective of the present invention to provide a high-capacity computer case with a greater applicability.

The structures, features, and objectives of the present invention can be better understood by studying the following detailed description of the preferred embodiment, in conjunction with the drawings provided herewith.

DETAILED DESCRIPTION OF THE PREFERRED EMBODIMENT

Figure 1:
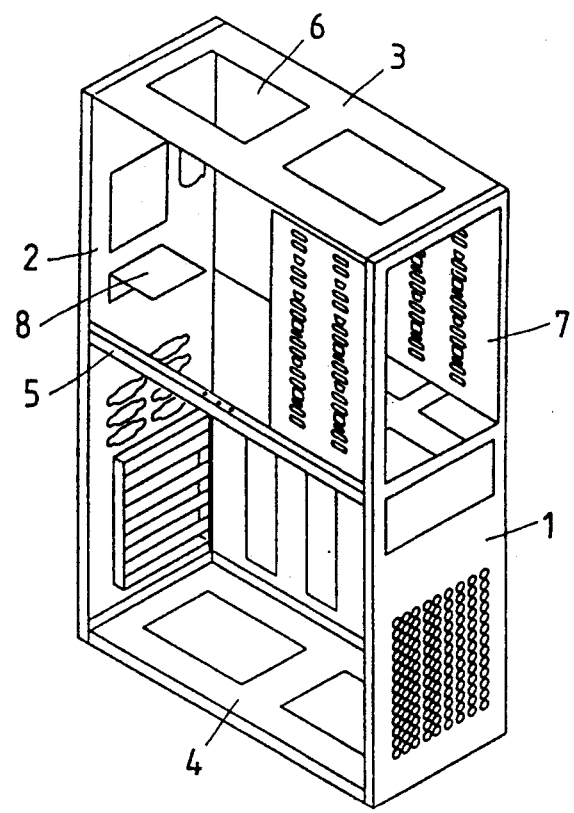
FIG. 1 shows a three-dimensional view of a conventional computer case of the prior art.
Figure 2:
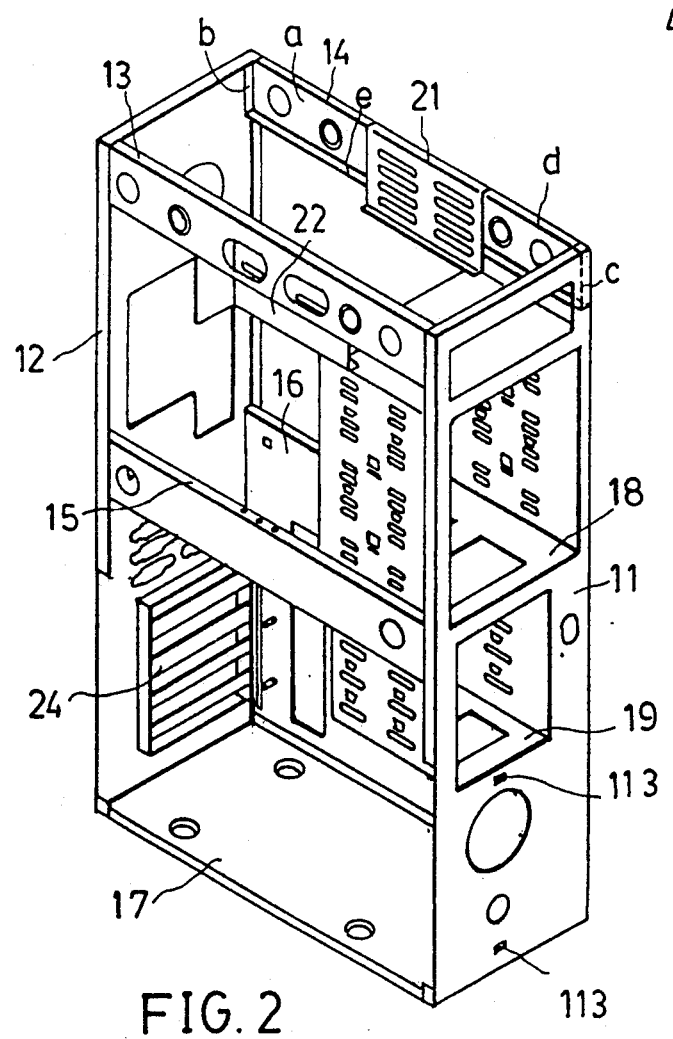
FIG. 2 shows a three-dimensional view of the high-capacity computer case of the present invention.

Referring to FIG. 2, the high-capacity computer case embodied in the present invention is shown comprising a front case plate 11, a rear case plate 12, three reinforced rods 13, 14 and 15 disposed in a parallel manner between the front case plate 11 and the rear case plate 12, a locking plate 16 for securing thereto the computer plate, and a bottom plate 17. The front case plate 11 is provided at the back thereof with an upper disk drive mount 18 and a lower disk drive mount 19. Located between the reinforced rods 13 and 14 and the upper disk drive mount 18 are two disk drive frame plates 21 and 22.

Figure 3:
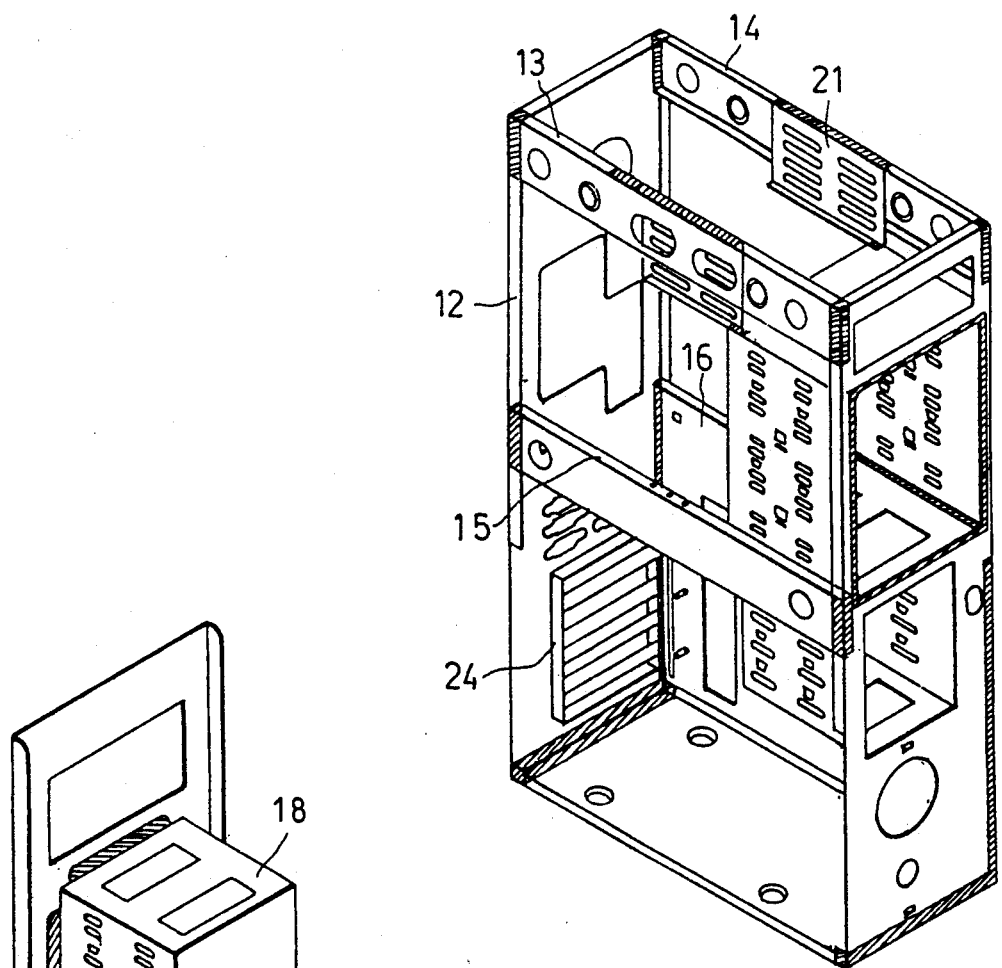
FIG. 3 shows a three-dimensional view of the high-capacity computer case of the present invention, in which the portions fixed by welding are indicated by shading.

Now referring to FIGS. 2 and 3, the interlocking portions of the components described above are shown by means of shading. The three reinforced rods 13, 14 and 15 are similar in shape and structure and are of U-shaped constructions in their cross sections. That is to say that a flat plate a is provided at four sides thereof with the reinforced structures of appropriate height which are bent into b, c, d, e so as to permit two or three sides of each of reinforced rods to be spot welded to the front and the rear case plates 11 and 12. The computer locking plate 16 is spot welded at both ends thereof to an inner side of the front and the rear case plates 11 and 12. Without supporting thereon any component of the computer, the bottom plate 17 are welded at both ends thereof to one side of the front and the rear case plates 11 and 12. In other words, the front case plate 11, the rear case plate 12, the reinforced rods 13, 14, 15, the locking plate 16, and the bottom plate 17 are put together to form a strong computer case resistant to impact by using a minimum of spot welding.

In addition, the disk drive frame plate 21 is fastened securely at one side thereof to the reinforced rod 14 and at other side thereof to the top of the upper disk drive mount 18 which is, in turn, coupled securely with the front case plate 11 and the locking plate 16. In a similar manner, the disk drive frame plate 22 is secured at one side thereof to the reinforced rod 13 and at other side thereof to the top of the upper disk drive mount 18 which is in turn coupled securely with the front case plate 11 and the locking plate 16. The bottom plate 17 is used to construct the bottom portion of the high-capacity computer case which is structurally strong, highly resistant to impact, and easy to be assembled.

Figure 4:
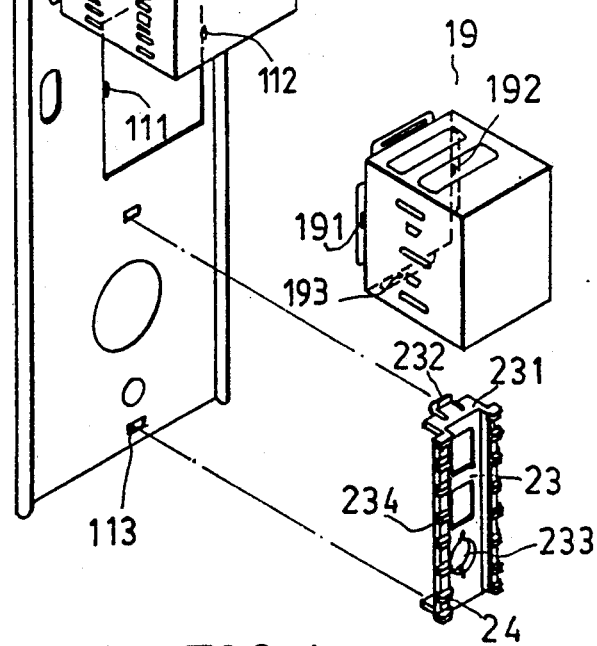
FIG. 4 shows an exploded view of the slot clip member secured firmly to the front plate of the high-capacity computer case embodied in the present invention.

As shown in FIG. 4, the lower disk drive mount 19 is provided with hang holes 191 and 192 located on the protruded edges of both sides thereof. The hang holes 191 and 192 are intended to engage with the hooks 111 and 112 disposed on the back of the front case plate 11 so as to facilitate the lower disk drive mount 19 to be disposed closely to the back of the front case plate 11. The lower disk drive mount 19 is further composed of screw hole 193 located at the protruded edge of the bottom thereof so as to ensure that the lower disk drive mount 19 is locked securely in place.

The high-capacity computer case of the present invention can be additionally provided with a slot clip member 23 of rectangular construction. The slot clip member 23 comprises axially along the long axis at one end thereof two lugs 231 of predetermined height. The lug 231 is provided with an arresting portion 232. The slot clip member 23 comprises a ventilation hole 233 and eight clip grooves 234. The front case plate 11 is provided at the lower portion of the back side thereof with two arresting holes 113 intended to engage with two arresting portions 232 so as to permit eight clip grooves 234 of the slot clip member 23 to be corresponding to the groove channels of an expansion groove 24 in order to clip firmly both ends of the expansion slot card of a greater dimension.

Figure 5:
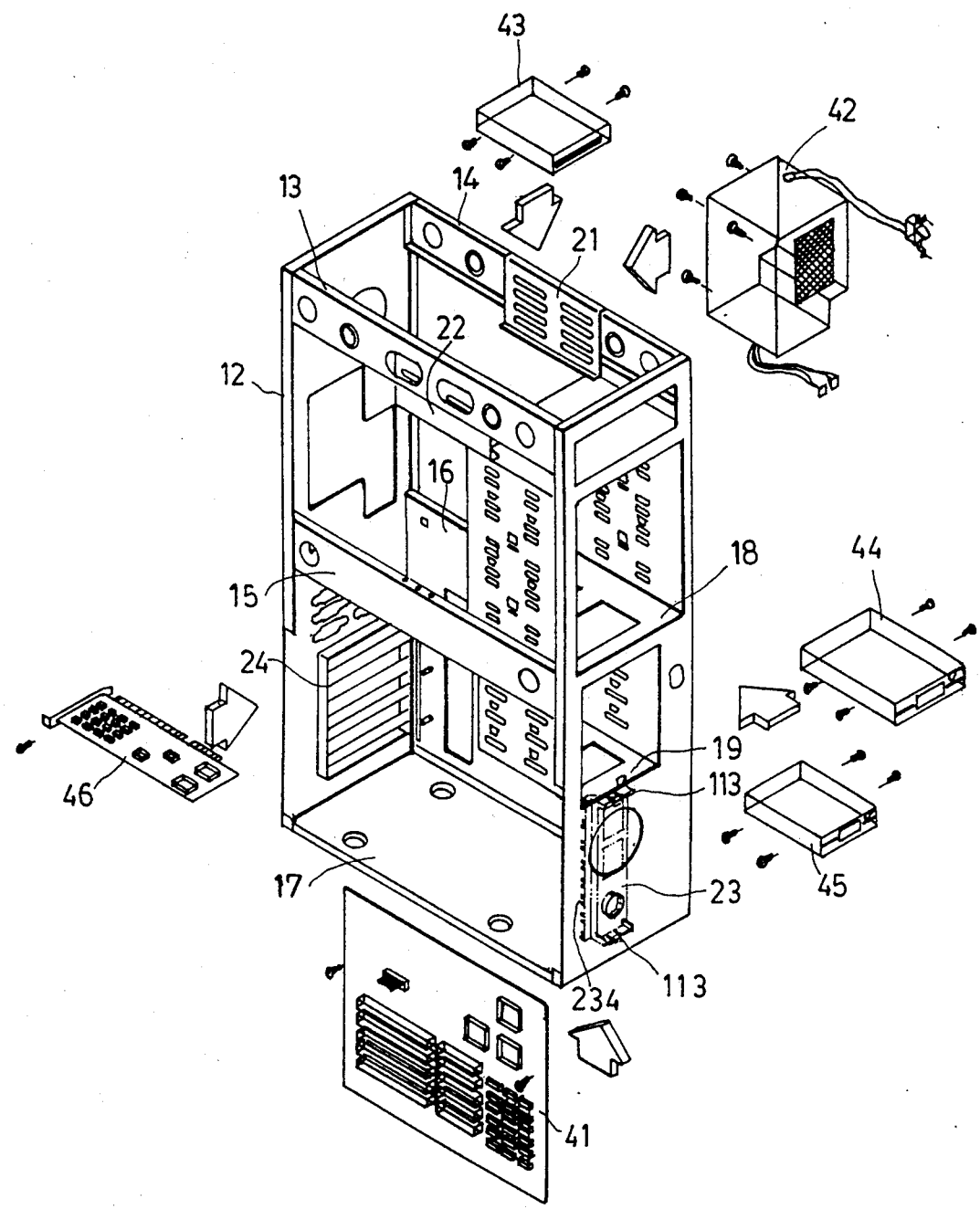
FIG. 5 shows a three-dimensional view of the high-capacity computer case of the present invention comprising therein various computer components.

As shown in FIG. 5, the high-capacity computer case of the present invention is provided therein with plenty of room for various computer components to be placed thereinto for assembly without interfering with one another. The assembly of the computer components in the high-capacity computer case of the present invention is outlined as follows:

(a) The main computer board 41 is arranged on the locking plate 16.

(b) The power supply device 42 is secured to the rear frame plate 12.

(c) Two 5¼" hard disk drives 43 are disposed securely in place between the two disk drive frame plates 21 and 22.

(d) Five 5¼" floppy disk drives 44 are arranged in the upper disk drive mount 18.

(e) Three 3½" hard disk drives 45 are arranged in the lower disk drive mount 19.

(f) The expansion slot card 46 is inserted into the expansion groove.

On the basis of the foregoing description, it is apparent that the high-capacity computer case of the present invention is unique in that it is constructed with a minimum of structural components, and that it is structurally strong to resist a severe impact, and further that it permits a flexible arrangement of disk drives. The upper disk drive mount 18 can accommodate five 5¼" floppy disk drives 44 while the lower disk drive mount 19 can receive therein three 3½" hard disk drives 45. In addition, two half-height 5¼" hard disk drives or one full-height 5¼" hard disk drive 43 can be disposed between the two disk drive frame plates 21 and 22. In other words, the high-capacity computer case of the present invention can accommodate therein ten disk drives without an increase in the size thereof. This is certainly a design break-through of the computer case. Such technological innovation solves the capacity problem of the computer housing.

In conclusion, the high-capacity computer case of the present invention has the features described as follows:

(a) The computer case is strong enough to resist a severe impact and is provided with three reinforced rods and two frame plates to support the upper disk drive mount.

(b) The computer case is capable of accommodating ten disk drives without an increase in the size thereof.

(c) The computer case is provided with greater entry room permitting an easy installation of the computer components.

(d) The stability of internal operation of the computer can be better assured by means of slot clip member which permits the long expansion slot card to be held securely at one end thereof in the expansion groove and at other end thereof in the slot clip member.

What I claim is:

1. A housing structure for a computer comprising:
   (a) a front case plate with a first upper disk drive mount and a second lower disk drive mount respectively engaged to an upper and a lower back side of said front case plate;
   (b) a rear case plate;
   (c) three reinforced rods disposed in a parallel manner between said front case plate and said rear case plate, each of said three reinforced rods having a U-shaped transverse cross-section and a flange at opposite ends thereof, two of said three reinforced rods being respectively welded at each said flange to an upper portion of said front case plate and said rear case plate, a remaining one of said reinforced rods being welded at each said flange at a center of one side of said front case plate and said rear case plate;
   (d) a computer locking plate arranged at a lower half portion of one side of said housing, with both ends of said locking plate being spot welded to said front case plate and said rear case plate;
   (e) a bottom plate with both ends thereof being welded to one side of said front case plate and to said rear case plate;
   (f) a detachable slot clip member detachably engaged to said lower back side of said front case plate,
   (g) said front case plate provided on said lower back side thereof with two hooks, and said lower disk drive mount having two hang holes engaged to said hooks;
   (h) a third upper disk drive mount comprising two disk drive frame plates each having a first horizontal portion connected at a right angle to a vertical portion, said vertical portion connected at a right angle to a second horizontal portion, said first and second horizontal portions extending on opposite sides of said vertical portion, wherein said first horizontal portions welded to sides of said two of said three reinforced rods, and said second horizontal portions of said two disk drive frame plates support therebetween at least one disk drive.

2. A housing structure according to claim 1, wherein said detachable slot clip member is rectangular and has means for detachably engaging said front case plate,
   said means for detachably engaging said front case plate comprising, two lugs disposed longitudinally at opposite ends of said detachable slot clip member, each of said lugs having an arresting portion, and said front case having at said lower back side, two arresting holes to receive therein each said arresting portion, and
   said detachable slot clip member having at least eight clip grooves.

* * * * *